United States Patent [19]

Vandebult

[11] 4,369,557

[45] Jan. 25, 1983

[54] PROCESS FOR FABRICATING RESONANT TAG CIRCUIT CONSTRUCTIONS

[76] Inventor: Jan Vandebult, 32 Averill St., Topsfield, Mass. 01983

[21] Appl. No.: 176,061

[22] Filed: Aug. 6, 1980

[51] Int. Cl.³ .................... H01G 4/26; H01F 41/04
[52] U.S. Cl. ........................ 29/25.42; 29/602 R; 29/848; 336/200; 340/572; 361/402
[58] Field of Search ............... 29/25.42, 602 R, 846, 29/848, 852, 593; 340/572; 361/402; 336/200; 427/79, 81

[56] References Cited

U.S. PATENT DOCUMENTS

| | | |
|---|---|---|
| 3,500,373 | 3/1970 | Minasy . |
| 3,688,361 | 9/1972 | Bonini ................................. 29/593 |
| 3,812,442 | 5/1974 | Muckelroy ..................... 336/200 X |
| 3,863,244 | 1/1975 | Lichtblau ............................ 340/572 |
| 3,864,824 | 2/1975 | Watson et al. .................. 29/593 X |
| 3,913,219 | 10/1975 | Lichtblau ............................ 29/592 |
| 3,967,161 | 6/1976 | Lichtblau ............................ 361/402 |
| 4,021,705 | 5/1977 | Lichtblau ............................ 361/402 |
| 4,024,629 | 5/1977 | Lemoine et al. ..................... 29/852 |

Primary Examiner—Carl E. Hall
Attorney, Agent, or Firm—Schwartz, Jeffery, Schwaab, Mack, Blumenthal & Koch

[57] ABSTRACT

An insulative substrate web having a conductive surface on a first face is printed and etched to provide a repetitive conductive circuit pattern. In one form of the invention, the pattern defines a first conductive area serving as a first capacitor plate, and an inductor connected thereto; conductive material is applied to the second face of the web to define a second conductive area aligned with the first conductive area and serving as a second plate of the capacitor, and a conductive strip connecting the second conductive area to the other end of the inductor. In another form of the invention, the pattern defines first and second conductive areas connected by an inductor; the web is folded so that the conductive areas are aligned to form respective plates of a capacitor. The web may form the capacitor dielectric, or an insulative layer may be inserted for this purpose; and the web is sealed to fix the capacitance. The web is severed to provide individual planar resonant tags.

19 Claims, 10 Drawing Figures

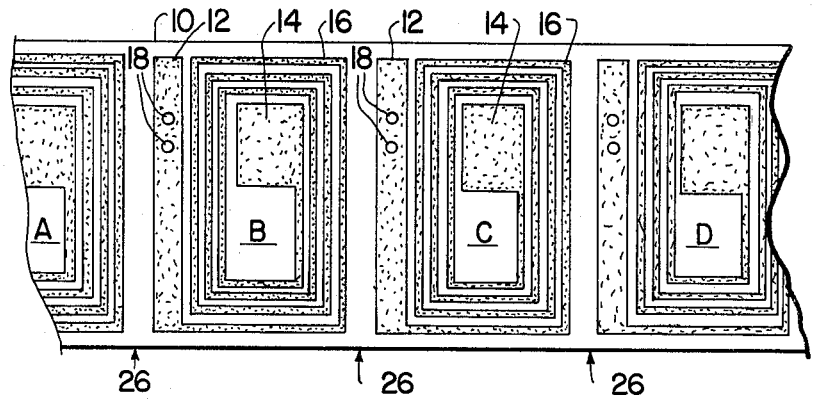
FIG. 1
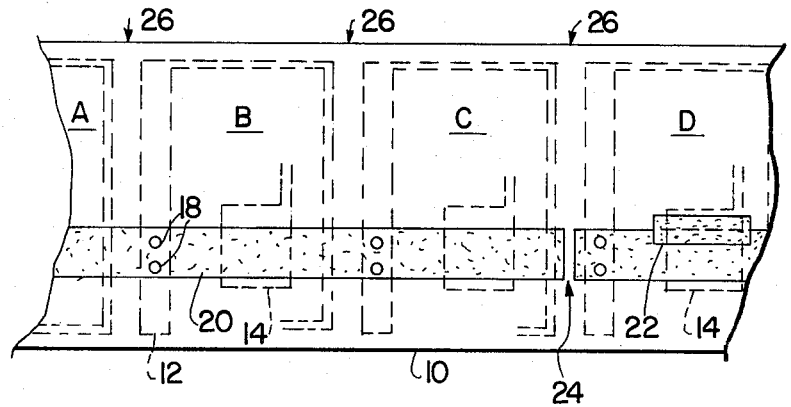
FIG. 2
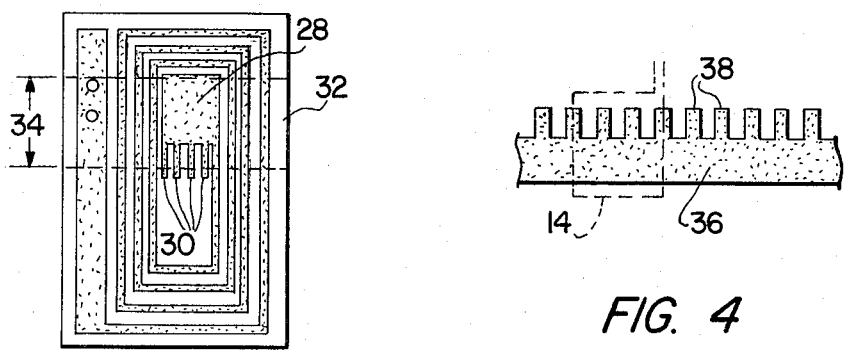
FIG. 3
FIG. 4

PROCESS FOR FABRICATING RESONANT TAG CIRCUIT CONSTRUCTIONS

BACKGROUND OF THE INVENTION

1. Field of the Invention

The invention relates to the construction and fabrication of thin, flexible resonant circuits with precise characteristics, particularly for use in electronic security and article theft detection systems.

2. The Prior Art

Article theft detection systems are known in which electromagnetic waves are generated at a checkpoint and are caused to sweep repetitively at a given rate through a predetermined frequency range. For example, as disclosed in U.S. Pat. No. 3,500,373, issued Mar. 10, 1970, a resonant electrical circuit tag is affixed to articles to be protected, the electrical circuit being resonant at a frequency within the swept frequency range. Changes in energy level which occur at the sweep repetition rate are detected, indicating presence of the tag in the field. The electrical circuit comprises a coil and a capacitor connected to form a resonant loop. The coil may comprise a number of windings of thin wire, each end of which is soldered or otherwise electrically connected to one terminal of a capacitor. A disadvantage of tags having a resonant circuit of this type is that significant hand labor, which is relatively costly, is required in their fabrication. A further disadvantage of such tags in their thickness, particularly in the region of the capacitor, which presents problems in some applications (such as in libraries, where the tags are affixed to book covers or pages, and in cases where the tag is laminated between sheets provided with adhesive so that the tag may be applied in the manner of an adhesive label).

U.S. Pat. Nos. 3,863,244 issued Jan. 28, 1975, and 3,967,161 issued June 29, 1976 disclose resonant tag circuits which are fabricated by printed or etched circuit techniques. The tag circuit comprises an insulative substrate having one portion of the circuit formed on one side of the substrate and another portion of the circuit formed on the opposite side of the substrate. Electrical connection is made between the portions of the circuit on opposite sides of the substrate by means of a conductive pin or eyelet extending through the substrate, or by means of a spot weld joining confronting circuit areas. U.S. Pat. No. 4,021,705, issued May 3, 1977, discloses a similar type of resonant tag circuit.

U.S. Pat. No. 3,913,219, issued Oct. 21, 1975, discloses a fabrication process for planar resonant tag circuits, in which both sides of a web of insulative material are provided with a conductive material to serve as conductive surfaces from which circuit patterns are formed by printed and etched circuit techniques. Electrical connection is established between the two conductive patterns on opposing faces of the web by welding confronting conductive surfaces, such as by ultrasonic welding or cold-welding with the aid of a tool having a chisel-like tip.

The techniques heretofore known for fabricating planar resonant tag circuits are not entirely satisfactory for volume production of low cost circuits with accurate tolerances and uniform electrical properties from tag to tag. Drawbacks of the known techniques which are utilized to chemically etch complete circuits on two faces of the insulative substrate web include the cost of the process involved, and the difficulty in maintaining close tolerances in the processes. Moreover, it is difficult to establish a reliable and durable electrical contact between the two opposing conductive surfaces. The cold-welding technique disclosed in U.S. Pat. No. 3,913,219, for example, results in low yields of usable tags, poor quality, and rejects in the field when the tag is bent.

The prior art process disclosed in U.S. Pat. No. 3,913,219 uses printed circuit etching techniques combined with printing of etch-resistant patterns on opposite surfaces of an insulative material of specific thickness and with specific dielectric properties. It is difficult with this technique to mass-produce resonant circuits for use at relatively higher frequencies within desired resonant frequency tolerances of 10% (plus or minus 5% of the center resonant frequency) due to variation in thickness and dielectric properties of the insulative material, variations of the printing and etching processes, and misalignment of the patterns on the opposing web faces.

Federal Communication Commission requirements dictate that the frequency and power level of the swept electromagnetic waves be held within fairly close tolerances, which in turn requires that the resonant tag circuits have a relatively high Q and that their resonant frequencies fall within a narrow range in order to assure that they will be detected by the system.

SUMMARY OF THE INVENTION

The present invention provides resonant tag circuit constructions and processes for their high-volume, low-cost production, the tag circuits having a relatively high Q and having a relatively uniform resonant frequency from tag to tag.

The present invention avoids the difficulties (such as alignment problems) encountered in the prior art processes in simultaneously printing and etching conductive paths on two surfaces of an insulative substrate web, and provides for adjustment of the resonant frequency of the tag so as to increase the yield of usable tags over the yield of the prior art devices and processes.

According to the processes of the present invention, a plurality of individual planar resonant tags is fabricated, each tag having at least one self-contained operative tuned circuit with integrally formed circuit elements including an inductor and a capacitor. According to one form of the process of the invention, an insulative substrate web of material of predetermined thickness and dielectric characteristics is provided, having first and second faces and a conductive surface on the first face. Printed on the conductive surface with an etchant-resistant material is a first repetitive circuit pattern defining a first conductive area serving as a first plate of the capacitor, and an inductor electrically connected at a first end thereof to the first conductive area.

The conductive surface is etched to remove unprinted portions of the conductive surface thereby to provide a first repetitive conductive circuit pattern conforming to the printed circuit pattern. Subsequently, a layer of conductive material is applied to the second web face in a second repetitive circuit pattern the second repetitive circuit pattern defining (1) a second conductive area in alignment with the first conductive area and serving as a second plate of the capacitor, and (2) a conductive strip effecting electrical connection between the second conductive area and a second end of the inductor. The web is then separated between adjacent repetitive circuit patterns to provide individual planar resonant tags.

The resonant frequencies of the tags can be continuously or intermittently monitored, and the tags may be "tuned" by increasing the plate area of one of the two plates of the capacitor subsequent to the initial fabrication process.

The tag produced thus comprises a planar substrate of electrically insulative material, with a conductive surface pattern on a first face thereof defining an inductor and a first conductive area electrically connected to a first end of the inductor. A pattern of conductive material applied to a second face of the substrate defines a second conductive area in at least partial alignment with the first conductive area, and a conductive strip effecting electrical connection between the second conductive area and a second end of the inductor. The conductive areas serve as capacitor plates, each of which is connected to one end of the inductor to form a resonant loop.

A second form of the process of the invention involves providing an insulative substrate web of material of predetermined thickness and dielectric characteristics and having first and second faces, with a conductive surface on the first face. A repetitive circuit pattern defining an inductor and first and second conductive areas electrically connected to the respective ends of the inductor is printed on the conductive surface with an etchant-resistant material. The conductive surface is then etched to remove unprinted portions on the conductive surface thereby to provide a repetitive circuit conforming to the printed circuit pattern.

The web and circuit pattern are then folded such that the first and second conductive areas are at least in part mutually aligned to form respective plates of the capacitor. The web and circuit pattern may be folded such that a double layer of the insulative substrate web forms a dielectric of the capacitor, or may be folded such that the conductive areas of the circuit pattern face each other, in which case a layer of insulative material may be inserted between the conductive areas to form the capacitor dielectric. The inserted layer of insulative material may be an edge portion of the substrate web. The folded web and circuit pattern is then sealed at least in a region over which the first and second conductive areas are mutually aligned, thereby fixing the capacitance of the capacitor. The web is separated between adjacent repetitive circuit patterns to provide individual planar resonant tags.

The resonant frequencies of the respective tags can be continuously or intermittently monitored and the individual tags may be "tuned" by modifying the thickness of the dielectric layer between the plates of the capacitor with application of heat and pressure.

The tag produced thus comprises a planar substrate of electrically insulative material, with a conductive surface pattern on one face thereof defining first and second conductive areas electrically connected by an inductor. The substrate is folded such that the conductive areas are aligned to form the plates of a capacitor, with a double layer of the substrate or an insulative insert therebetween. The tag is bonded together at least in the region of the capacitor plates to fix the capacitance of the capacitor.

Further features and advantages of the resonant circuit tags and processes for their fabrication according to the present invention will become apparent from the detailed description which follows with reference to the drawings.

BRIEF DESCRIPTION OF THE DRAWINGS

FIG. 1 shows in plan view a first face of an insulative substrate web section having a repetitive printed circuit pattern etched in a conductive layer thereon;

FIG. 2 shows a reverse face of the insulative substrate web section of FIG. 1, with a stripe of conductive material applied thereto for completing the resonant tag circuits;

FIG. 3 shows a severed insulative substrate web section having a printed circuit pattern etched in a conductive layer on one face thereof, similar to the printed circuit pattern of FIG. 1 but including a capacitor plate formed with registration marks;

FIG. 4 illustrates schematically a modification of the embodiment of FIG. 2 in which a stripe of conductive material is applied to the reverse face of the insulative substrate web with registration marks;

THE PREFERRED EMBODIMENTS

Figure 5:
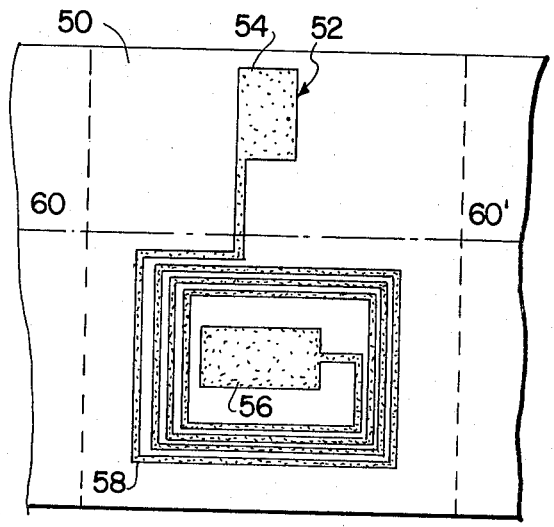
FIG. 5 shows a printed circuit pattern which is etched repetitively in a conductive layer on an insulative substrate web, and which is to be folded and sealed to complete the tuned resonant circuit.

A first preferred form of the invention will now be described with reference to FIGS. 1-4. FIG. 1 shows a first face of a portion of an insulative substrate web 10. This face of the insulative substrate web is provided with a conductive surface on which a first repetitive circuit pattern 12 has been printed with an etchant-resistive material and which has been etched to produce a first repetitive conductive circuit pattern conforming to the printed circuit pattern. FIG. 1 shows repetitions "B" and "C" of the repetitive pattern in full, as well as portions of repetitions "A" and "D" of the pattern. Each repetition defines a first conductive area 14 which serves as a first plate of the capacitor of the tuned circuit, and an inductor 16 electrically connected at one end thereof to conductive area 14. The free end of each inductor 16 has one or more holes 18 punched therethrough and extending through the insulative substrate web 10. The hole or holes 18 are preferably aligned in a longitudinal direction of the insulative substrate web 10 with at least a portion of conductive area 14, for purposes which will now be described with reference to FIG. 2.

FIG. 2 shows the reverse face of the insulative substrate web, with representative portions of printed circuit pattern repetitions "A", "B", "C" and "D" shown in dashed lines. Holes 18 are also shown, which extend through the insulative substrate web 10. After the substrate web 10 with repetitive circuit patterns 12 and holes 18 as shown in FIG. 1 has been prepared, a stripe of conductive paint or epoxy is applied to the second face (shown in FIG. 2) of the insulative substrate web, in alignment with holes 18 and conductive areas 14. The conductive paint or epoxy makes electrical contact with the free end of each printed circuit pattern through holes 18, while the portion of the conductive paint or epoxy stripe which overlaps conductive area 14 of each repetitive circuit pattern defines a second plate of the capacitor of the resonant tag circuit. That is, each conductive area 14 forms a first plate of a capacitor of the respective tag circuit, while a portion of conductive paint or epoxy stripe 20 forms a second plate of the tag circuit capacitor, the insulative substrate web forming a dielectric therebetween.

Tolerance variations in the repetitive circuit pattern provided on the first face of the insulative substrate web as shown in FIG. 1 are compensated when the conductive paint or epoxy stripe is applied to the second face of the insulative substrate web as shown in FIG. 2. It will be readily apparent to those of skill in the art that the resonant frequency of each tag will depend upon the inductance of coil 16 and the capacitance of the capacitor formed by a conductive area 14 and the portion of conductive stripe 20 which overlaps conductive area 14. Since the inductance is substantially fixed once the repetitive circuit patterns have been etched on the first face of the insulative substrate web, the resonant frequency of the tags can be readily controlled by controlling the width of stripe 20.

Although the precise characteristics and tolerances of the repetitive circuit patterns may vary somewhat from batch to batch, the repetitive circuit patterns within a given batch can be expected to fall within a fairly narrow range. When a continuous longitudinal span of the insulative substrate web is provided with the repetitive circuit patterns and wound on a spool, the web may be fed, with the aid of a suitable drive apparatus, past a roller, pad, or brush which applies the conductive stripe 20 to the second face of the substrate web. The resonant frequency of each individual tag can be immediately tested to determine whether it falls within an acceptable frequency band (using apparatus such as described in U.S. Pat. No. 3,500,373). If the tag frequencies are not within the desired band width, the width of the conductive stripe 20 can be adjusted by varying the pressure of the conductive paint or epoxy applicator against the substrate web. The stripe 20 of conductive material is preferably continuous as shown for circuit repetitions "A", "B" and "C" in FIG. 2. However, the applicator may be cycled by means of a cam or the like to provide gaps 24 in the conductive stripe 20 between adjacent circuit patterns Holes 18 or other registration markings on or openings in the web may be employed to synchronize gaps 24 in conductive stripe 20 with the repetitive circuit patterns on the front face of the substrate web.

Alternatively, the conductive stripe 20 can be deliberately kept slightly narrower than necessary to achieve the desired resonant tag frequency. Thus, increasing the mutually overlapping plate area of the capacitor plates is necessary to bring the resonant frequency of each tag within the desired frequency band width. This may be effected, as shown for circuit repetition "D" in FIG. 2, by applying an additional quantity of conductive epoxy or paint 22 in electrical contact with conductive stripe 20 and overlapping a portion of conductive area 14 not previously overlapped. This final step could be performed manually and, with practice, very quickly and accurately to provide "fine tuning" of the finished resonant tag circuit. It will be recognized that the additional quantity of conductive paint or epoxy 22 need not necessarily be applied to increase the width of stripe 20, but could instead be applied to the front face of the insulative substrate web to increase the effective capacitor plate area of conductive area 14. Those of skill in the art will recognize that the repetitive circuit pattern shown in FIG. 1 is merely illustrative and could be modified to provide additional free space adjacent conductive areas 14 in the longitudinal direction, to permit manual application of a quantity of conductive paint or epoxy for "fine tuning" the circuit.

Once the resonant circuits have been completed, the web is severed at arrows 26 to provide individual planar resonant tags. For affixing the tags to items to be protected, individual tags are usually laminated between appropriate outer layers of paper, plastic, or other material. Such outer surfaces can be provided by laminating the roll of tags and subsequently cutting the individual tags from the laminated roll. The tag circuits may be adhesively laminated to paper or other suitable sheet material by passing the web through pressure rollers together with a paper or other sheet having a pressure sensitive adhesive on the surface confronting the web, as described in U.S. Pat. No. 3,913,219. The laminated web may be fed to a rotary die cutter which cuts apart the individual resonant circuit tags.

FIG. 3 shows a modified printed circuit pattern which is etched in the conductive surface on the first face of the insulative substrate web. In particular, the circuit pattern of FIG. 3 has a conductive area 28 (corresponding to conductive area 14 of FIG. 1) which includes a number of fingers 30 extending outwardly thereof. Although four fingers 30 are shown, any suitable number may be provided. The stripe of conductive material 32 applied to the reverse side of the insulative substrate web (corresponding to stripe 20 in FIG. 2) overlaps fingers 30. Preferably, the width of conductive stripe 32 is controlled such that the capacitance of the capacitor thereby formed is less than necessary for the resonant tag circuit to fall within the desired frequency range. Adjustment is effected by painting in the notches between fingers 30 with conductive paint or epoxy to increase the capacitance. Preferably, each notch represents a predetermined increment of capacitance (and, hence, frequency).

FIG. 4 shows schematically the relationship between a conductive area 14 of the repetitive circuit pattern (as in FIG. 2), and a conductive stripe 36 applied to the second face of the insulative substrate web (similar to stripe 20 in FIG. 2). Conductive stripe 36 has, however, a plurality of fingers 38 extending to one side thereof. The capacitance of the capacitor can be increased by painting in the notches between fingers 38 in the region overlapping conductive area 14. Preferably, each notch represents a predetermined increment of capacitance, for example, one picofarad.

While the conductive stripes 20, 32, and 36 may be applied as conductive paint or hardenable conductive epoxy, it is contemplated that these could alternatively be applied by hot-stamping the second face of the insulative substrate web with a metallized layer.

It will be recognized from the foregoing description that the first preferred form of the present invention does not require etching of circuit patterns on both sides of the substrate web, and avoids the expense and difficulty involved in simultaneously etching circuit portions on both sides of the web which must be carefully co-aligned. In addition, the first preferred form of the invention avoids the need for welding the confronting conductive surfaces on opposing faces of the web.

The substrate web is an electrically insulative material having a low dissipation factor at a frequency of interest, and a stable dielectric constant; typically, synthetic materials such as polyethylene, polypropylene, polyester (Mylar) and polyisobutylene are suitable for the purpose. Polyethylene is especially preferred by reason of its low cost and easy bondability to aluminum foil which is preferably employed for the conductive surface by reason of its relatively low cost. The conductive surface can also be of other electrically conductive materials such as silver or copper. The substrate film has a typical thickness of 0.0005-0.002 inches, with a typical thickness tolerance of ±5%. The film is preferably treated by corona discharge, by passing the film between two charged plates providing an ionizing atmosphere therebetween, such that there is a constant static discharge between the plates and through the film. This treatment is similar to that employed for providing a printable surface on synthetic material, and conditions the surface of the synthetic material so that it can be more easily bonded to the aluminum foil.

Fabrication of the substrate is as described in U.S. Pat. No. 3,913,219, wherein an extruder having an extrusion die emits a continuous web of high density polyethylene or other suitable material onto a cooled metal plate. The film is then passed through corona discharge treating apparatus such as charged plates energized by a source, after which the web is wound on a storage reel or directed to the next processing station.

The layer of conductive material provided on the first face of the substrate web is preferably aluminum by reason of its good conductivity and relatively low cost. The aluminum foil layer is laminated to a first face of the substrate web, with the dull side of the foil in contact with the substrate web, by means of heated pressure rollers, the laminated web then being wound on a storage reel. The dull side of the aluminum foil is in contact with the substrate web to provide better bondability to the substrate than the opposite shiny aluminum surface. The dull side of the foil has a greater surface roughness than the shiny surface, and, therefore, provides greater surface area for bonding to the substrate. Moreover, the shiny surface, being of finer texture than the dull surface, contains less residual oil from the foil-rolling process and thus ink adheres more readily to the shiny surface. Printing can be accomplished on the dull foil surface so long as the surface is sufficiently free of residual oil to permit adherence of ink. In the preferred forms of the invention, no chemical cleaning of the conductive foil is required. Printing on the dull surface would usually require chemical or similar cleaning treatment prior to application of ink.

The aluminum foil is preferably about 0.001-0.002 inch thick, with the aluminum preferably being of type 1145 dead soft. It will be recognized that the Q of the resonant tag circuits is to be as high as reasonably possible, while minimizing the cost of the tag. While aluminum is relatively inexpensive in comparison to copper, silver, and other suitable metals, its relatively higher resistance dictates use of a relatively thicker layer of the material or of relatively wide inductor windings in the printed circuit pattern. With aluminum, the inductor windings preferably have a width of about 0.050 inch. The capacitor area is typically 0.1-0.2 square inch, which results in a capacitance of about 50-100 when the substrate thickness is 0.001 inch. A typical size for the completed tag is about 1-2 inch in length and 1-2 inch in width.

The laminated web is next printed with the particular repetitive circuit pattern required for the resonant tags being produced. Preferably the web is sufficiently wide that a plurality of repetitive patterns is printed across the width of the laminated web to provide a plurality of resonant tags which are subsequently separated in a longitudinal direction by slitting the web into a plurality of strips.

Printing is preferably accomplished in a web fed rotogravure press. The ink is of a type providing good coverage with substantially no pin-holes or other breaks which would effect circuit formation. The print rollers of the press are configured to promote maximum ink coverage and the ink is preferably a black carbon-filled nitrocellulose-based lacquer or a vinyl-based ink. As an example, black nitrocellulose ink, Sun Chemical Company No. 73793, may be employed, the ink being diluted in a solvent containing in appropriate proportions one-third tolual, one-third ethyl acetate and one-third ethyl alcohol. The ink is diluted until a viscosity is achieved for intended ink-coverage, and printing of the repetitive circuits pattern on the aluminum surface is accomplished by a rotogravure press operating with a web-speed of, for example, 200 feet per minute.

The circuit pattern is printed on the aluminum surface by a print-roller working in cooperation with a backing roller. Drawing apparatus can be provided for drawing the ink following the application. Such apparatus can include heaters for heating the ink to cause greater fusion to the aluminum surface, as is desirable for certain types of ink such as vinyl-based ink. The heat is sufficient to melt the vinyl which is in suspension in the ink composition to cause fusion of the vinyl particles to each other and to the aluminum to thereby more efficiently bond the ink to the aluminum surface.

Depending upon the layout of a particular processing facility, the web can next be directed to an etching station, or if the etching facility is located at a different site, the web is rewound and conveyed to the etching facility. At an etching station, the printed web is passed through continuous spray etching apparatus to chemically remove all unprinted aluminum foil on the web. The web is then rinsed to remove the etchant chemicals, and dried. The web can then be rewound onto a reel for conveyance to the next processing facility for punching holes 18 and applying the conductive stripe to the reverse face of the web.

During the etching process, the printing ink is not removed, thereby providing considerable saving of processing time and cost. The etchant typically is a dilute ferric chloride solution applied in a spray with accurate control of temperature, concentration, and pump pressure in conjunction with the web speed employed in a particular process.

The roll of etched printed circuits is preferably slit into narrower rolls of, for example, one or two tag widths to permit subsequent processing in an economical manner on commercially standard label processing equipment. The holes 18 may be punched, the conductive stripes 20, 32 or 36 applied, and the tags laminated on standard label processing equipment.

Any of a number of suitable materials may be applied to form the conductive stripes. For example, conductive paint, such as Methode 1050 available from Methode Electronics, Inc., Chicago, Ill., hardenable conductive epoxy, such as EPOTEC 430 or a stripe of hot-stamped metallized material, such as Aluminum Metallization available from Thermark, Schererville, Ind. may be employed.

Additional preferred forms of the invention will now be described with reference to FIGS. 5-8. FIG. 5 shows an insulative substrate web 50 on which is provided a conductive layer printed and etched to define a repetitive circuit pattern 52 having a first conductive area 54, a second conductive area 56, and an inductor 58 electrically connected at respective ends to conductive areas 54, 56.

Figure 8:
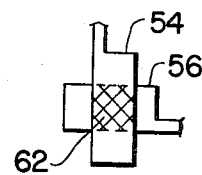
FIG. 8 shows schematically the manner in which the capacitor of the tuned resonant circuit is formed when the printed circuit patterns and substrate webs of FIGS. 5-7 are folded.

After the printed circuit patterns have been etched, the insulative substrate web is slit (if the printing and etching process produces a web having plural etched circuits across its width) to produce a web as shown in FIG. 5 having a single longitudinal repetitive series of the printed circuits. The web is then folded along the chain-dotted line 60-60' such that the conductive circuit is on the outside and a double layer of the substrate web lies therebetween. The pattern is designed such that when the web is folded in this manner the conductive areas 54, 56 are at least in part mutually aligned to form respective plates of the capacitor of the circuit, with the double layer of the insulative substrate web lying therebetween forming a dielectric of the capacitor. The folded insulative substrate web is then sealed at least in a region over which the conductive areas 54, 56 are mutually aligned, thereby fixing the capacitance of the capacitor. FIG. 8 illustrates the relationship of conductive areas 54, 56 when the web is thus folded, with cross-hatched area 62 representing the effective area of the capacitor plates. Preferably, the repetitive circuit pattern 52 is designed such that variation in capacitative coupling between overlapping portions of the inductor will be minimized. Alternatively, the web may be folded such that the conductive areas 54, 56 face each other, and a layer of insulative material inserted therebetween and sealed to form the capacitor dielectric. The inserted layer may be an edge portion of the substrate web.

The sealing of the folded tag can be effected in any suitable manner. Preferably, the substrate web (and inserted insulative layer, if used) comprises a film of thermoplastic material, such as polyethylene, which will bond together under application of heat and pressure. For this purpose, the folded web may be fed through heated pressure rollers or the like. Alternatively, the insulative substrate web may comprise two or more layers of suitable insulative film laminated together, for example, a 0.0005 inch thick film of polyester material (Mylar) bonded to a film of 0.0005 inch thick polyethylene. The first face of the web, on which the conductive layer is provided, is of polyester, while the second face of the web is polyethylene, so that the applied heat can be set to melt only the polyethylene layer. Since the polyester layer has a higher melting temperature, its thickness is unaffected by the application of heat and pressure.

Application of heat and pressure to the folded web, when the web or a lamination thereof (and the inserted insulative layer, if used) comprises a thermoplastic material, causes the thermoplastic material to soften and bond to itself, thereby fixing the capacitance of the capacitor. The capacitance can be controlled by regulating the applied pressure to thereby control the thickness of the dielectric between conductive areas 54, 56, which serve as plates of the capacitor. The sealing may be effected over the entire folded width of the web, or simply in the region of the capacitor plates 54, 56.

Alternatively, an adhesive can be applied to the face areas of the insulative web (and inserted layer, if used) which will confront one another when the web is folded and the web then folded and pressed to effect sealing and fix the capacitor value.

The resonant frequencies of the circuits can be measured before severing the web to form individual planar resonant tags. This can be done, for example, by feeding the web past antennae coupled respectively to a transmitter which sweeps through a band of frequencies and a receiver which detects resonance of the tags. If it appears that the capacitance must be adjusted, this may be effected by passing the web again through a pair of heated pressure rollers to reduce the dielectric thickness of the capacitor and thereby "fine tune" the resonant circuits. Since the circuits on a given web can be expected to exhibit nearly uniform properties from tag to tag (assuming that the material properties and process parameters have been maintained relatively constant throughout the processing of a given web), the frequencies at which the individual tags resonate will fall within a narrow range. Preferably, the initial sealing process is carried out such that the dielectric thickness of each capacitor is greater than required for the desired resonant tag frequency, so that the "fine tuning" of the tags by application of additional heat and pressure will place the tags within the desired resonant frequency range.

Figure 5A:
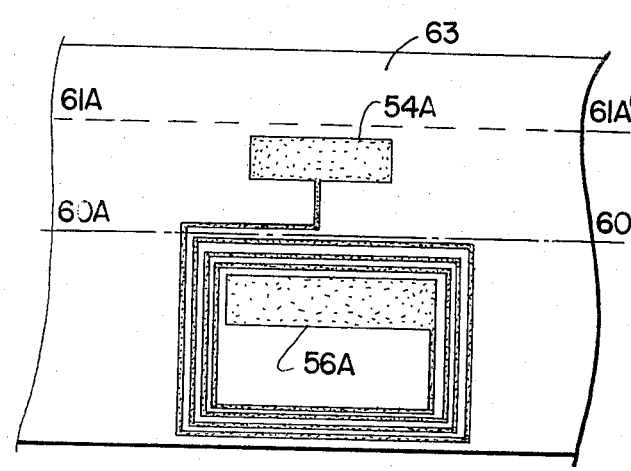
FIG. 5A shows a modification of the printed circuit pattern of FIG. 5.

FIG. 5A shows a modification of the circuit pattern of FIG. 5, in which conductive areas 54A, 56A are both rectangular and have their long side aligned with and as close as possible to the fold line 60A-60A' to conserve raw material and keep the finished tag as small as possible. The insulative substrate web of FIG. 5A has an unprinted edge portion 63 which allows folding along fold line 61A-61A'; when folded, portion 63 defines an insulative insert which forms part or all of the capacitor dielectric.

Figure 6:
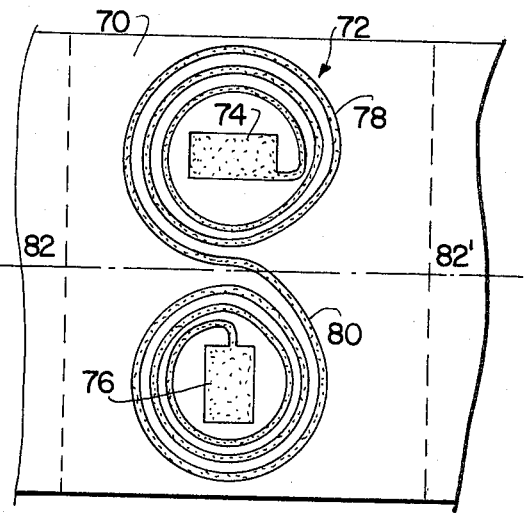
FIG. 6 shows a further form of a printed circuit pattern, which is foldable to complete the tuned resonant circuit and which has an increased number of inductor windings per unit area.
Figure 9:
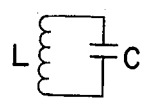
FIG. 9 shows an equivalent circuit for the tuned resonant tag circuits produced in accordance with the invention.

FIG. 6 illustrates a further segment of an insulative substrate web 70 on which is provided a repetitive conductive circuit pattern 72. Pattern 72 includes a first conductive area 74, a second conductive area 76, and an inductor having first and second portions 78, 80 electrically connecting the two conductive areas 74, 76. The web and circuit pattern of FIG. 6 are folded along a fold line 82-82' such that conductive areas 74, 76 are at least in part mutually aligned to form a capacitor in the manner described above with reference to FIGS. 5 and 8. An advantage of the circuit pattern shown in FIG. 6 is that a larger number of inductor windings can be provided for a given tag size. If desired, the circuit pattern can be designed such that the web may be folded more than once, thereby further increasing the number of inductor windings per unit area of the finished resonant tag circuit.

Figure 7:
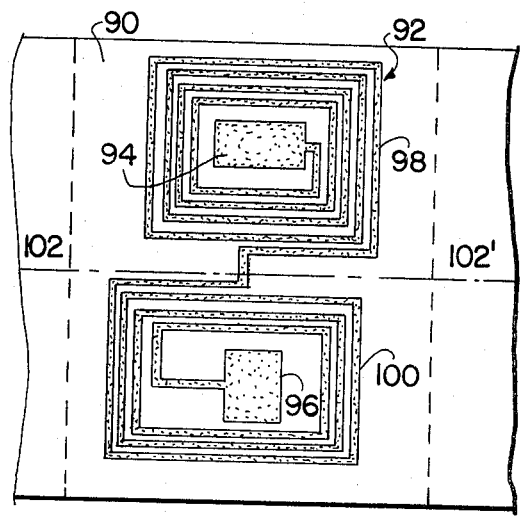
FIG. 7 shows yet another form of the printed circuit pattern which is foldable to complete the resonant circuit, similar to the pattern of FIG. 6.

FIG. 7 shows still a further segment of an insulated substrate web 90 provided with a repetitive conductive circuit pattern 92. The circuit pattern includes conductive areas 94, 96 joined by an inductor having a first portion 98 and a second portion 100. The web is folded along chain-dotted line 102-102' and subsequently sealed as described above. It will be recognized that the windings of first inductor portions 78, 98 and second inductor portions 80, 100 as shown in FIGS. 6 and 7, respectively, are wound in respective directions such that current flowing in the inductor windings when the tag is energized will flow in the same direction in adjacent windings. Preferably, the patterns are designed such that the coil windings on opposing faces of the folded and sealed web are not exactly opposite one another, in order thereby to reduce the capacitive coupling between the windings. Those of skill in the art will recognize, however, that the precise capacitance of the tag capacitor, the precise inductance of the tag inductor, the amount of capacitive coupling between adjacent opposing inductor windings, and the like, are not in and of themselves of significance, so long as the resonant frequency of the finished tag circuit is within an acceptable range about the desired resonant frequency and the Q of the tag is sufficiently high to permit detection with apparatus which operates within the transmitted power levels permitted by the Federal Communication Commission.

Further modifications within the spirit and scope of the invention of the resonant tag circuit constructions and processes described above will become apparent to those of skill in the art. The present invention is not intended to be limited by the foregoing description, but is defined by the claims which follow.

What is claimed is:

1. A method for fabricating a plurality of individual planar resonant tags, each tag having at least one self-contained operative tuned circuit with integrally formed circuit elements including an inductor and a capacitor, the method comprising the steps of:
   providing an insulative substrate web of material of predetermined thickness and dielectric characteristics and having first and second faces and a conductive surface on said first face;
   printing on said conductive surface with an etchant-resistive material a repetitive circuit pattern defining an inductor and first and second conductive areas electrically connected to respective ends of said inductor;
   etching said conductive surface to remove unprinted portions of said conductive surface thereby to provide a repetitive circuit pattern conforming to said printed circuit pattern;
   folding said web and said repetitive circuit pattern such that a double layer of the insulative substrate web lies between the folded printed circuit pattern and such that the first and second conductive areas are at least in part mutually aligned to form respective plates of said capacitor, with said double layer of the insulative substrate web therebetween forming a dielectric of the capacitor;
   sealing the double layer of the insulative substrate at least in a region over which the first and second conductive areas are mutually aligned, thereby fixing the capacitance of the capacitor; and
   separating said web between adjacent said repetitive circuit patterns to provide individual planar resonant tags.

2. The method according to claim 1, wherein said step of sealing comprises applying an adhesive material to said second web face at least in the region to be sealed, and pressing together the double layer of the insulative substrate web at least in the region to be sealed, thereby fixing the capacitance of the capacitor.

3. The method according to claim 1, wherein the insulative substrate web comprises a thermoplastic material, and the step of sealing comprises applying heat and pressure to the folded web and printed circuit pattern at least in the region to be sealed, thereby fixing the capacitance of the capacitor.

4. The method according to claim 3, wherein the insulative substrate web comprises a multi-layered web having a layer of polyester film which forms said first web face bonded to a layer of polyethylene film which forms said second web face.

5. The method according to claim 3, wherein the insulative substrate web comprises a film of polyethylene.

6. The method according to one of claims 1 to 5, further comprising the steps of:
   measuring the resonant frequency of each tag; and
   subsequently applying heat and pressure to the tag at least in the region of the capacitor to thereby adjust the capacitance of the capacitor and therewith tune the resonant tag to a desired frequency.

7. The method of claim 1, wherein said step of printing comprises printing each repetition of said circuit pattern with said first conductive area and a first portion of said inductor on one side of a fold line along which the web and circuit pattern is to be folded, and said second conductive area and a second portion of said inductor on the other side of said fold line such that, when etched, said first and second inductor portions are electrically connected.

8. The method of claim 7, wherein said step of printing further includes printing the circuit pattern such that each of said first and second inductor portions includes a plurality of inductor turns.

9. The method of claim 8, wherein said step of printing further includes printing the circuit pattern such that inductor turns of said first inductor portion run in a direction opposite the turns of said second inductor portion, whereby when said web and circuit pattern are folded and the resonant tag circuit is energized, current flows in the same direction in adjacent turns of said first and second inductor portions.

10. The method of claim 9, wherein said step of printing further includes printing the circuit pattern such that, when said web and circuit pattern are folded along said fold line, the turns of said first inductor portion are substantially misaligned with respect to the turns of said second inductor portion, whereby capacitive coupling between said first and second inductor portions through the insulative substrate web is minimized.

11. A method for fabricating a plurality of individual planar resonant tags, each tag having at least one self-contained operative tuned circuit with integrally formed circuit elements including an inductor and a capacitor, the method comprising the steps of:
   providing an insulative substrate web of material of predetermined thickness and dielectric characteristics and having first and second faces and a conductive surface on said first face;
   printing on said conductive surface with an etchant-resistive material a repetitive circuit pattern defining an inductor and first and second conductive areas electrically connected to respective ends of said inductor;
   etching said conductive surface to remove unprinted portions of said conductive surface thereby to provide a repetitive circuit pattern conforming to said printed circuit pattern;
   folding said web and said repetitive circuit pattern such that the first and second conductive areas are at least in part mutually aligned to form respective plates of said capacitor;

inserting a layer of insulative material between confronting surfaces of the folded web and circuit pattern at least in the region of said first and second conductive areas, the inserted layer forming a dielectric of the capacitor;

sealing the folded web and circuit pattern and inserted layer at least in a region over which the first and second conductive areas are mutually aligned, thereby fixing the capacitance of the capacitor; and separating said web between adjacent said repetitive circuit patterns to provide individual planar resonant tags.

12. The method of claim 11, wherein said web and repetitive circuit pattern are folded such that a double layer of the insulative substrate web lies between the folded printed circuit pattern, and said layer of insulative material is inserted intermediate the double layer of the insulative substrate web, whereby the double layer of the insulative substrate web and the inserted insulative layer together form the dielectric of the capacitor.

13. The method of claim 11, wherein said web and repetitive circuit pattern are folded such that the folded printed circuit pattern lies between the folded insulative substrate web, whereby the inserted insulative layer is in contact with said first and second conductive areas and forms the dielectric of the capacitor.

14. The method of claim 11, wherein the inserted layer of insulative material comprises an edge portion of the insulative substrate web.

15. A method for fabricating a plurality of individual planar resonant tags, each tag having at least one self-contained operative tuned circuit with integrally formed circuit elements including an inductor and a capacitor, the method comprising the steps of:

providing an insulative substrate web of material of predetermined thickness and dielectric characteristics and having first and second faces;

providing on one of said faces a repetitive circuit pattern defining an inductor and first and second conductive areas electrically connected to respective ends of said inductor;

folding such web and said repetitive circuit pattern such that a double layer of the insulative substrate web lies between the folded repetitive circuit pattern and such that the first and second conductive areas are at least in part mutually aligned to form respective plates of said capacitor, with said double layer of the insulative substrate web there-between forming a dielectric of said capacitor;

sealing the double layer of the insulative substrate at least in the region over which the first and second conductive areas are mutually aligned, thereby fixing the capacitance of the capacitor; and separating said web between adjacent repetitive circuit patterns to provide individual planar resonant tags.

16. A method for fabricating a plurality of individual planar resonant tags, each having at least one self-contained operative tuned circuit with integrally formed circuit elements including an inductor and a capacitor, the method comprising the steps of:

providing an insulative substrate web of material of predetermined thickness and dielectric characteristics and having first and second faces;

providing on one of said faces a repetitive circuit pattern defining an inductor and first and second conductive areas electrically connected to respective ends of said inductor;

providing an insulative substrate dielectric having a desired dielectric constant;

folding said web such that one portion of said repetitive circuit pattern engages one surface of said dielectric and another portion of said repetitive circuit pattern engages another surface of said dielectric and further such that the first and second conductive areas are at least in part mutually aligned to form respective plates of said capacitor with said dielectric located therebetween;

sealing the substrate dielectric to the circuit layer of the insulative pattern at least in a region over which the first and second conductive areas are mutually aligned, thereby fixing the capacitance of the capacitor; and separating said web between adjacent repetitive circuit patterns to provide individual planar resonant tags.

17. A method for fabricating a plurality of individual planar resonant tags, each tag having at least one self-contained operative tuned circuit with integrally formed circuit elements including an inductor and a capacitor, the method comprising the steps of:

providing a layer of conductive material;

forming a repetitive circuit pattern from said conductive material defining at least an inductor and first and second conductive areas electrically connected to respective ends of said inductor;

folding said repetitive circuit pattern such that the first and second conductive areas are at least in part mutually aligned to form respective plates of said capacitor;

sealing said folded circuit pattern to an insulative material such that said insulative material is positioned between said conductive areas thereby fixing the capacitance of said capacitor; and separating said conductive material and said insulative material between adjacent repetitive circuit patterns to provide individual planar resonant tags.

18. The method as set forth in claim 17, wherein the step of providing comprises providing an insulated substrate web of material with said conductive layer being formed on one surface of said web, and said step of forming comprises etching said conductive material.

19. The method as set forth in claim 18, wherein the step of folding comprises folding both said web and said repetitive circuit pattern such that said conductive areas face each other, then inserting said insulative material between said conductive areas.

* * * * *